US008072762B2

(12) United States Patent
Li et al.

(10) Patent No.: US 8,072,762 B2
(45) Date of Patent: Dec. 6, 2011

(54) PRINTED CIRCUIT BOARD ASSEMBLY

(75) Inventors: Yang Li, Shenzhen (CN); Shuang Fu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 104 days.

(21) Appl. No.: 12/695,689

(22) Filed: Jan. 28, 2010

(65) Prior Publication Data

US 2011/0090647 A1  Apr. 21, 2011

(30) Foreign Application Priority Data

Oct. 21, 2009  (CN) .......................... 2009 2 0312976

(51) Int. Cl.
  *H05K 7/20* (2006.01)
  *G06F 1/20* (2006.01)
(52) U.S. Cl. .............. 361/719; 361/679.47; 361/679.48; 361/679.52; 361/679.54; 361/695; 361/697; 361/700; 361/704; 361/709; 361/710; 165/80.3; 165/185; 174/15.2; 174/16.1; 174/16.3
(58) Field of Classification Search .......... 361/679.46–679.48, 679.52, 679.54, 361/690, 694–695, 697, 699–700, 704, 709–710, 361/719; 165/80.2–80.3, 104.33, 185; 174/15.2, 174/16.1, 16.3
See application file for complete search history.

(56) References Cited

U.S. PATENT DOCUMENTS

| 7,295,437 | B2 * | 11/2007 | Lee et al. ....................... 361/700 |
| 7,520,316 | B2 * | 4/2009 | Xia et al. ................. 165/104.33 |
| 7,532,476 | B2 * | 5/2009 | Sauciuc ........................ 361/704 |
| 7,694,727 | B2 * | 4/2010 | Yang et al. .............. 165/104.33 |
| 7,697,293 | B1 * | 4/2010 | Peng et al. ..................... 361/700 |
| 7,753,109 | B2 * | 7/2010 | Min et al. ................. 165/104.33 |
| 7,755,894 | B2 * | 7/2010 | Yang et al. .................... 361/700 |
| 7,782,617 | B2 * | 8/2010 | Li et al. ......................... 361/700 |
| 2003/0183373 | A1 * | 10/2003 | Sarraf et al. ............. 165/104.33 |
| 2007/0263357 | A1 * | 11/2007 | Ju ................................ 361/702 |
| 2007/0268670 | A1 * | 11/2007 | Chu et al. ...................... 361/702 |
| 2009/0223647 | A1 * | 9/2009 | Alousi et al. ................. 165/80.3 |
| 2009/0321054 | A1 * | 12/2009 | Qin et al. ................. 165/104.26 |
| 2010/0002391 | A1 * | 1/2010 | Jiang et al. .................... 361/697 |

FOREIGN PATENT DOCUMENTS

| JP | 03074864 | A | * | 3/1991 |
| JP | 08222672 | A | * | 8/1996 |

* cited by examiner

*Primary Examiner* — Robert J Hoffberg

(74) *Attorney, Agent, or Firm* — Altis Law Group, Inc.

(57) ABSTRACT

A printed circuit board assembly includes a printed circuit board, a first heat dissipating module, and a second heat dissipating module. The printed circuit board includes a first heat generating element and a second heat generating element. The first heat dissipating module is disposed on the first heat generating element. The first heat dissipating module includes a heat sink and a first heat pipe. The first heat pipe includes a pipe body and an extending portion extending from the pipe body. The second heat dissipating module is disposed on the second heat generating element. The pipe body is connected to the heat sink and the extending portion is connected to the second heat dissipating module.

14 Claims, 3 Drawing Sheets

US 8,072,762 B2

PRINTED CIRCUIT BOARD ASSEMBLY

BACKGROUND

1. Technical Field

The disclosure generally relates to printed circuit board assemblies, especially to a printed circuit board assembly having heat dissipating modules.

2. Description of Related Art

Electronic devices, such as central processing units (CPUs), in computers generate a lot of heat that can affect operation and may cause damages if the heat is not removed from the electronic devices efficiently.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
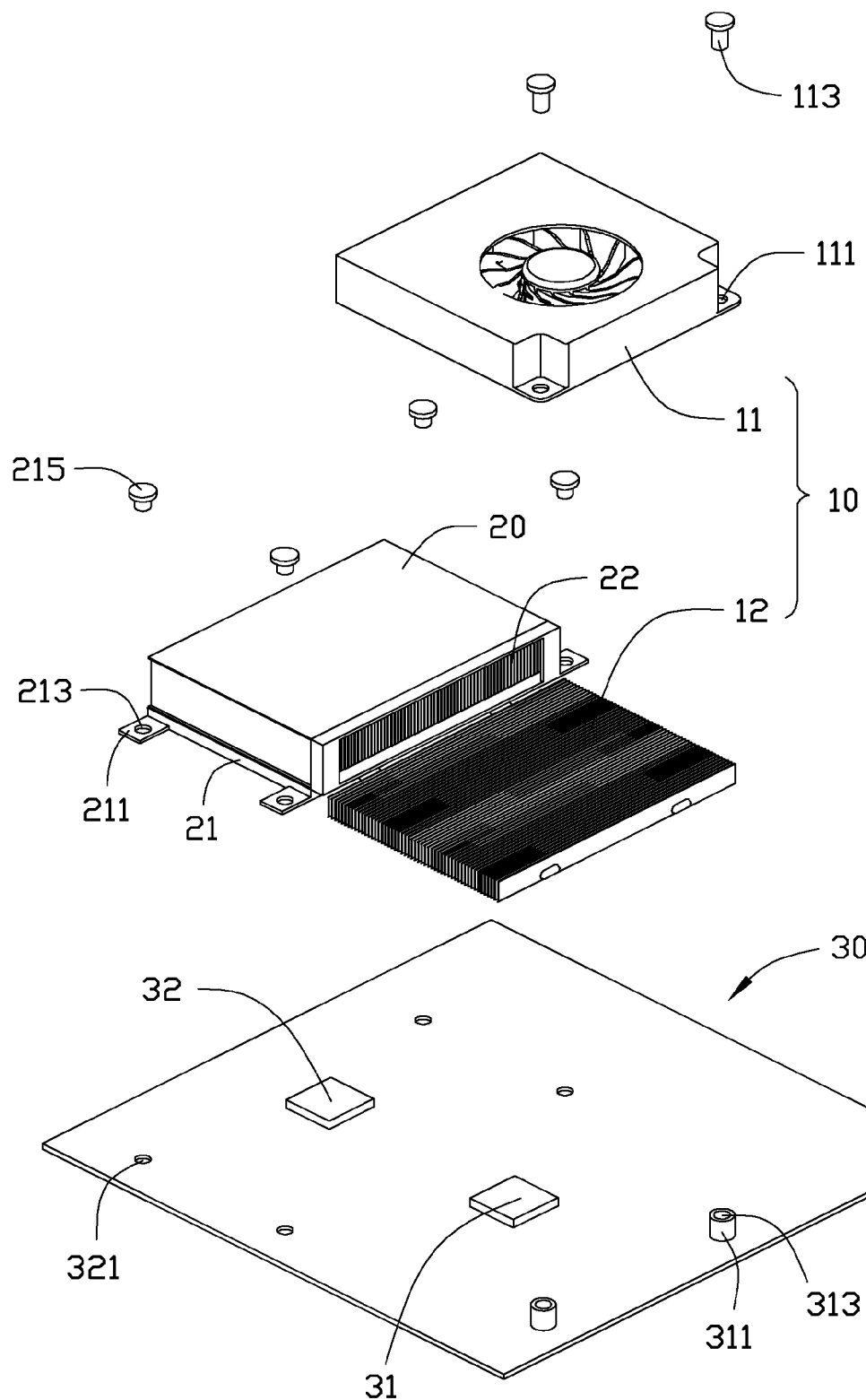
FIG. 1 is an exploded, isometric view of a printed circuit board assembly of an embodiment.
Figure 2:
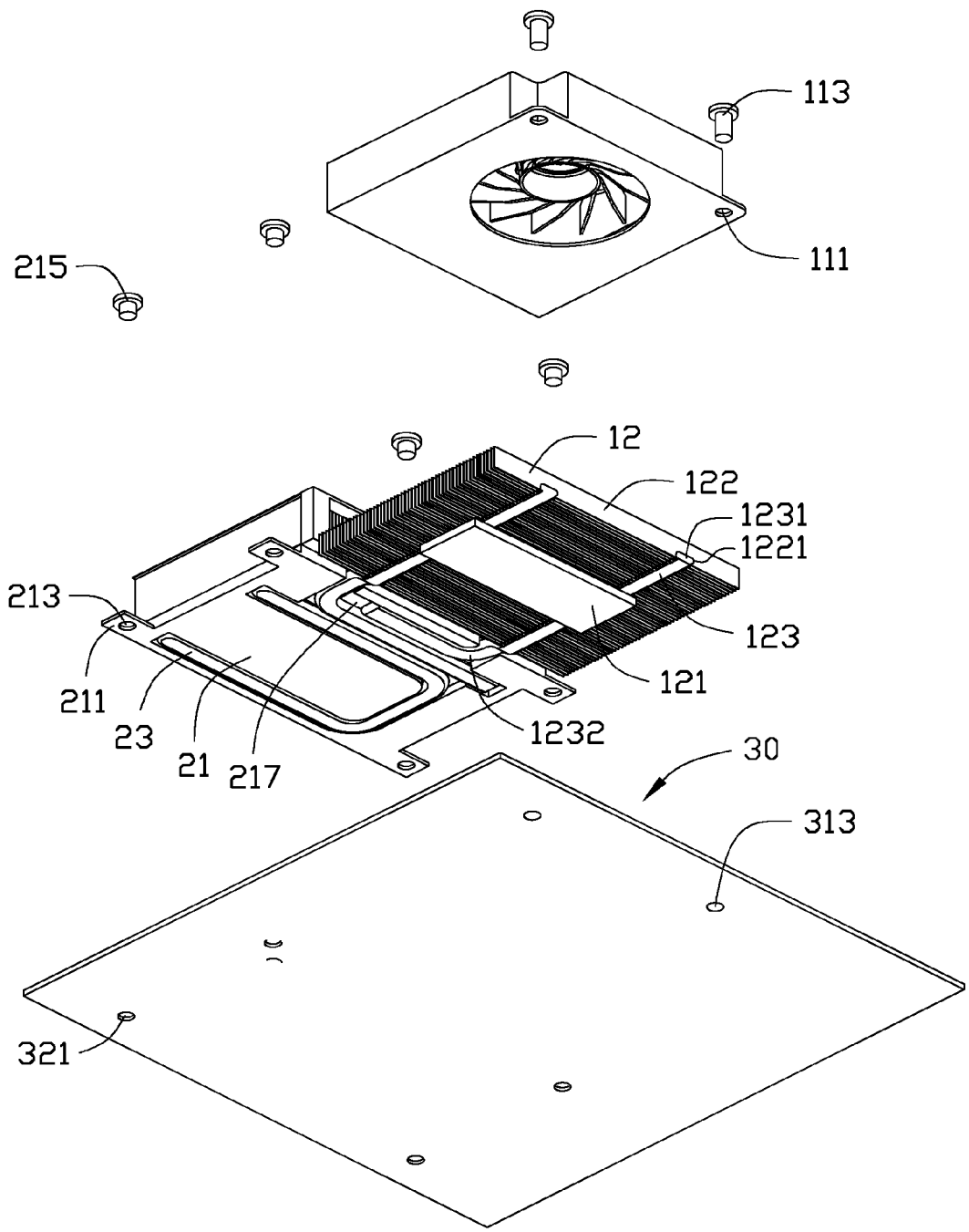
FIG. 2 is similar to FIG. 1, but viewed from another aspect.

Referring to FIGS. 1 and 2, a printed circuit board assembly includes a first heat dissipating module 10, a second heat dissipating module 20, and a printed circuit board 30.

The first heat dissipating module 10 includes a fan 11 and a heat sink 12. The fan 11 is mounted at a top side of the heat sink 12. The heat sink 12 is disposed between the fan 11 and the printed circuit board 30. The fan 11 defines two through holes 111. The heat sink 12 includes a first base 121, a plurality of first fins 122, and two L-shaped first heat pipes 123. Each first heat pipe 123 includes a pipe body 1231 and an extending portion 1232 bent from the pipe body 1231. Pipe bodies 1231 of the two first heat pipes 123 are disposed in recesses 1221 in a lower surface of the plurality of first fins 122 and the pipe bodies 1231 of the two first heat pipes 123 contact a top of the first base 121 of the heat sink 12.

The second heat dissipating module 20 includes a second base 21, a plurality of second fins 22, and a U-shaped second heat pipe 23 mounted on the second base 21. The second base includes four securing portions 211 and a groove 217 in a lower surface of the second base 21. Each securing portion 211 defines an assembly hole 213 the extending portion 1232 of the first heat pipe 123 is disposed in the groove of the second base 21 of the second heat dissipating module 20.

The printed circuit board 30 includes a first heat generating element 31 and a second heat generating element 32. In one embodiment, the first heat generating element 31 is a CPU, and the second heat generating element 32 is a north bridge chip. The printed circuit board 30 includes two protrusions 311. Each protrusion 311 defines a fastening hole 313 corresponding to the through hole 111 of the fan 11. The printed circuit board 30 defines four securing holes 321 corresponding to the assembly holes 213 of the second heat dissipating module 20.

Figure 3:
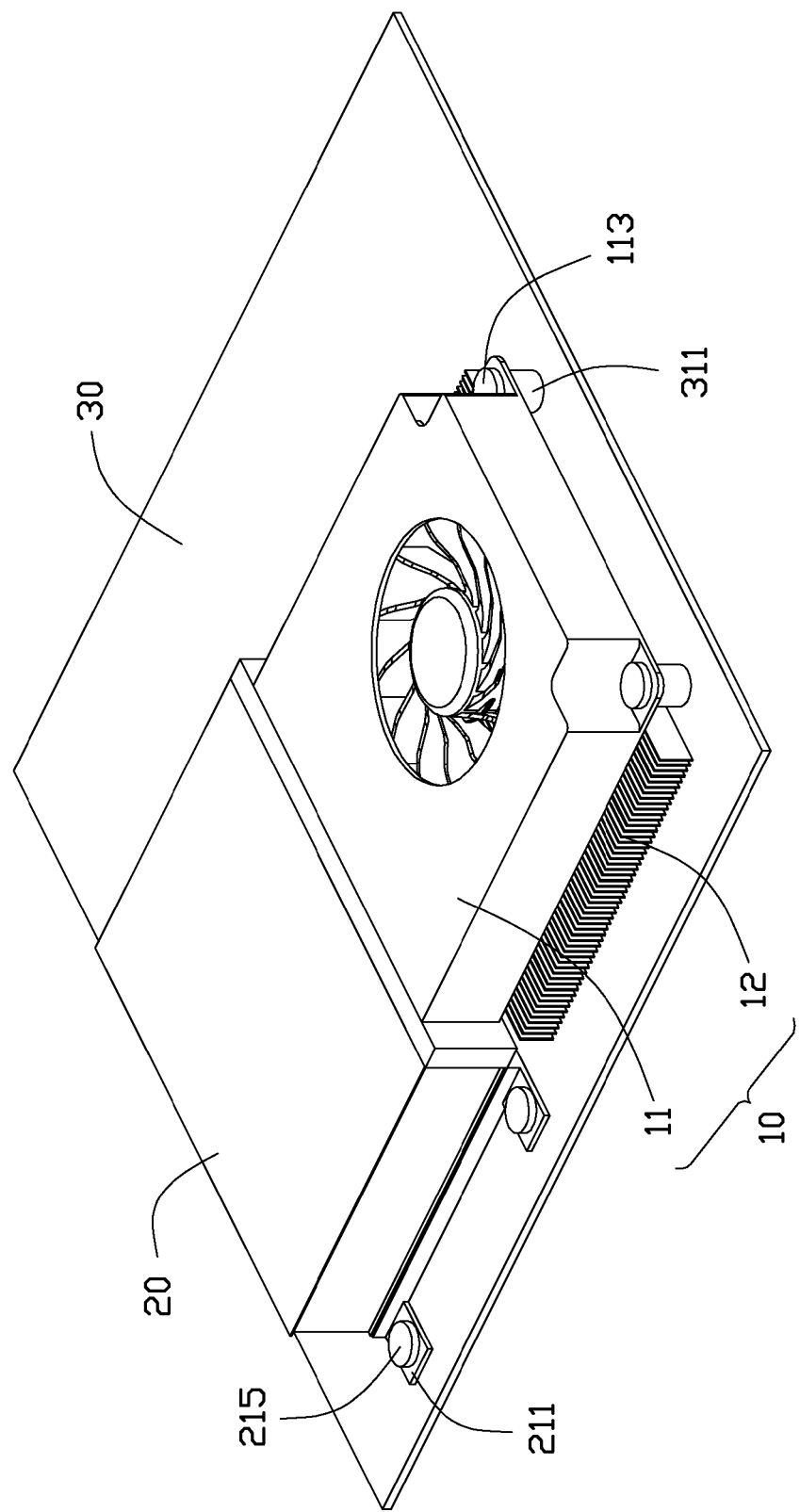
FIG. 3 is an assembly view of FIG. 1.

Referring to FIGS. 1 to 3, in assembly, the four assembly holes 213 of the second heat dissipating module 20 are aligned with the four securing holes 321. The first base 121 of the first heat dissipating module 10 contacts the first heat generating element 31 of the printed circuit board 30. The second base 21 of the second heat dissipating module 20 contacts the second heat generating element 32 of the printed circuit board 30. Four fasteners 215, such as screws, are secured in the through holes 111 and the securing holes 321 to secure the second heat dissipating module 20 and the heat sink 12 of the first heat dissipating module 10 to the printed circuit board 30. The fan 11 is disposed on the heat sink 12 to ensure the through holes 111 correspond to the fastening holes 313 of the printed circuit board 30 respectively. Two fasteners 113 extend through the through holes 111, and then are secured in the fastening holes 313 to secure the fan 11 to the heat sink 12.

The first heat dissipating module 10 channels some of the heat generated by the first heat generating element 31 to the second heat dissipating module 20 via the extending portion 1232 of the first heat pipe 123 when the temperature of the first heat dissipating module 10 is higher than that of the second heat dissipating module 20.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board assembly, comprising:
a printed circuit board comprising a first heat generating element and a second heat generating element;
a first heat dissipating module disposed on the first heat generating element, the first heat dissipating module comprising
a heat sink, the heat sink comprises a first base contacting the first heat generating element and a plurality of first fins having a recess in a lower surface of the plurality of first fins, the plurality of first fins disposed on the first base and
a first heat pipe, the first heat pipe extends into the recess of the plurality of first fins and contacts a top of the first base, the first heat pipe comprising a pipe body and an extending portion extending from the pipe body; and
a second heat dissipating module disposed on the second heat generating element, the second heat dissipating module comprising a second base contacting the second heat generating element, the second base having a groove in a lower surface of the second base, and a plurality of second fins disposed on the second base;
wherein the pipe body is disposed between the first base and the plurality of first fins and located within the recess of the plurality of first fins, and the extending portion is disposed between the second heat generating element and the second base and located within the groove of the second base.

2. The printed circuit board assembly of claim 1, wherein the first heat dissipating module further comprises a fan mounted on the heat sink, and the heat sink is disposed between the fan and the printed circuit board.

3. The printed circuit board assembly of claim 2, wherein the fan defines a through hole, and the printed circuit board defines a fastening hole corresponding to the through hole; a fastener is inserted into the through hole and then screwed into the fastening hole to secure the fan on the heat sink.

4. The printed circuit board assembly of claim 1, wherein the second heat dissipating module further comprises a second heat pipe connected to the second base.

5. The printed circuit board assembly of claim 4, wherein the second heat pipe is generally U-shaped.

6. The printed circuit board assembly of claim 1, wherein the second base comprises a securing portion defining an assembly hole, the printed circuit board defining a securing hole corresponding to the assembly hole; a fastener is located in the assembly hole and the securing hole to secure the second heat dissipating module on the printed circuit board.

7. The printed circuit board assembly of claim 1, wherein the first heat pipe is generally L-shaped.

8. A printed circuit board assembly, comprising:
a printed circuit board comprising a heat generating element;
a first heat dissipating module disposed the heat generating element, the first heat dissipating module comprising
a heat sink, the heat sink comprising a first base contacting the heat generating element and a plurality of first fins having a recess in a lower surface of the plurality of first fins, the plurality of first fins disposed on the first base, and
a first heat pipe, the first heat pipe comprising a pipe body disposed in the recess of the plurality of first fins and contacts a top of the first base of the heat sink and an extending portion extending from the pipe body; and
a second heat dissipating module comprising a second base having a groove in a lower surface of the second base, and a plurality of second fins disposed on the second base;
wherein the extending portion of the first heat pipe is disposed in the groove of the second base.

9. The printed circuit board assembly of claim 8, wherein the first heat dissipating module further comprises a fan mounted on the heat sink, and the heat sink is disposed between the fan and the printed circuit board.

10. The printed circuit board assembly of claim 9, wherein the fan defines a through hole, and the printed circuit board defines a fastening hole corresponding to the through hole; a fastener is inserted into the through hole and then screwed into the fastening hole to secure the fan on the heat sink.

11. The printed circuit board assembly of claim 8, wherein the second heat dissipating module further comprises a second heat pipe connected to the second base.

12. The printed circuit board assembly of claim 11, wherein the second heat pipe is generally U-shaped.

13. The printed circuit board assembly of claim 8, wherein the second base comprises a securing portion defining an assembly hole, the printed circuit board defining a securing hole corresponding to the assembly hole; a fastener is located in the assembly hole and the securing hole to secure the second heat dissipating module on the printed circuit board.

14. The printed circuit board assembly of claim 8, wherein the first heat pipe is generally L-shaped.

* * * * *